(12) United States Patent
Barr et al.

(10) Patent No.: US 7,026,545 B2
(45) Date of Patent: Apr. 11, 2006

(54) FLEX CABLE HAVING A RETURN-SIGNAL PATH AND METHOD FOR REDUCING LENGTH AND IMPEDANCE OF A RETURN-SIGNAL PATH

(75) Inventors: Andrew Harvey Barr, Roseville, CA (US); Jeremy Ian Wilson, Rocklin, CA (US); Robert William Dobbs, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/447,939

(22) Filed: May 28, 2003

(65) Prior Publication Data

US 2004/0238194 A1 Dec. 2, 2004

(51) Int. Cl.
*H01B 11/02* (2006.01)
(52) U.S. Cl. .................................. 174/33; 174/117 F
(58) Field of Classification Search ............. 174/33, 174/36, 113 C, 117 F, 117 FF, 250, 255, 174/113 R; 333/243, 1
See application file for complete search history.

(56) References Cited

U.S. PATENT DOCUMENTS

| | | | | |
|---|---|---|---|---|
| 5,003,273 A | * | 3/1991 | Oppenberg | 333/1 |
| 5,027,074 A | * | 6/1991 | Haferstat | 324/539 |
| 5,120,905 A | * | 6/1992 | Cousin et al. | 174/113 C |
| 6,495,763 B1 | * | 12/2002 | Eichmann et al. | 174/113 R |
| 6,521,843 B1 | * | 2/2003 | Kohya | 174/255 |

* cited by examiner

Primary Examiner—Chau N. Nguyen

(57) ABSTRACT

A device and method are provided for reducing impedance, impedance discontinuities, and signal-loop area in flex cables used for a signal path. In one embodiment of the invention, a flex cable is provided for reducing the impedance and length of a return-signal path. The flex cable includes a signal conductor, and a return-signal conductor not connected to ground. The flex cable may also include a ground conductor. Such a flex cable provides a shorter- and lower-impedance return-signal path between a signal source and receiver than do conventional flex cables. In another embodiment of the invention, a method is provided that includes the steps of delivering a signal from a signal source to a signal receiver with a flexible conductor, and returning the signal from the signal receiver to the signal source with another flexible conductor other than ground.

20 Claims, 5 Drawing Sheets

FLEX CABLE HAVING A RETURN-SIGNAL PATH AND METHOD FOR REDUCING LENGTH AND IMPEDANCE OF A RETURN-SIGNAL PATH

BACKGROUND

A driver is typically used to drive an electrical signal onto a conductive path such as a trace, which is connected to a receiver. The signal requires a return path from the receiver back to the driver. More specifically, to generate a positive voltage signal in a theoretical sense, the driver generates the signal by removing positive charge from a supply node such as a VCC node, and driving the positive charge onto the conductive path to the receiver. Once the charge reaches the receiver, it returns to the VCC node of the driver via a return path having the least impedance (if there are multiple return paths to choose from). Unfortunately, the longer this path and the higher its impedance, the more likely the signal is to generate cross talk or electromagnetic interference (EMI). Often the driver and receiver are mounted on separate circuit boards that are connected by a flexible cable, or flex cable.

FIG. 1 is a block diagram illustrating a driver 10 located on a circuit board 1 and a receiver 20 located on a circuit board 2 and coupled by a flex cable 30 having a conductor 32 for conducting a signal $I_S$. Typically, a high-speed electrical signal will switch between two voltages, here VCC and ground (GND). VCC is a voltage that is normally carried by power planes 12 and 22 on the boards 1 and 2, respectively, and GND is typically carried on respective GND planes of the boards 1 and 2. The flex cable 30 typically includes a ground trace or plane (not shown) that connects the GND planes on the boards 1 and 2. Here a "plane" is a conductor that covers virtually the entire area of one layer of the circuit board, and "trace" is a conductor that is much thinner than a plane, and thus covers only a small area of one layer of the circuit board. Thus, a circuit board layer may include many traces and no plane, or include only one plane but no traces.

Still referring to FIG. 1, the conductor 32 provides the signal $I_S$ path to the receiver 20. To complete the electrical circuit, the charge delivered to the receiver 20 must return to the VCC plane 12 via a return-signal $I_R$ path. Thus, a charge must flow from the power plane VCC 12, through the driver 10, the conductor 32, the receiver 20, and then a return path back to the power plane VCC 12. The return charge finds a path through the flex cable 30. Such a return path is typically long and has significant high impedance, such that a loop formed by the signal Is path through the conductor 32 and the return-signal $I_R$ path radiates significant amounts of EMI and causes significant amounts of cross talk.

FIG. 2 is a block diagram illustrating the components of FIG. 1 where the flex cable 30 includes a ground plane 36 that is connected to the ground planes of the boards 1 and 2, and a by-pass capacitor $C_B$ that couples the ground plane of the board 1 to the VCC plane 12 of the board 1. Although the ground plane 36 is an element of, and thus included within, the flex cable 30, it is shown outside of the flex cable 30 for illustrative purposes.

Because the ground plane 36 presents a low impedance path, the return charge typically follows a return path from the receiver 20 through the ground plane of the board 2 to the ground plane 36 of the flex cable, through the ground plane of the board 1 and the by-pass capacitor $C_B$, to the VCC plane 12. The ground plane 36 can be selected by circuit designers for a return path because it typically has a lower high-frequency impedance than other possible return paths existing on the boards 1 and 2. Furthermore, using the ground plane provides a return loop that is typically smaller and has less impedance than other possible return paths, and thus generates less EMI and less cross talk. However, the by-pass capacitor $C_B$ typically has a non-zero impedance even at high frequency, and thus may present an impedance mismatch between the ground plane of the board 1 and the VCC plane 12. Unfortunately, this mismatch may still cause the signal loop to generate significant levels of EMI and cross talk.

Although a signal $I_S$ generated from a positive supply VCC is discussed, the claimed invention is applicable to a signal that is generated from a negative supply voltage as well.

SUMMARY

In one embodiment of the invention, a flex cable is provided for reducing the impedance and length of a return-signal path. The flex cable includes a signal conductor, and a return-signal conductor not connected to ground. The flex cable may also include a ground conductor. Such a flex cable provides shorter and lower-impedance return-signal path between a signal source and receiver than do conventional flex cables.

These and various other features as well as advantages of the present invention will be apparent from a reading of the following detailed description and a review of the associated drawings.

DETAILED DESCRIPTION

In the following detailed description of exemplary embodiments of the invention, reference is made to the accompanying drawings, which form a part hereof. The detailed description and the drawings illustrate specific exemplary embodiments by which the invention may be practiced. These embodiments are described in sufficient detail to enable those skilled in the art to practice the invention. It is understood that other embodiments may be utilized, and other changes may be made, without departing from the spirit or scope of the present invention. The following detailed description is therefore not to be taken in a limiting sense, and the scope of the present invention is defined by the appended claims.

Figure 5:
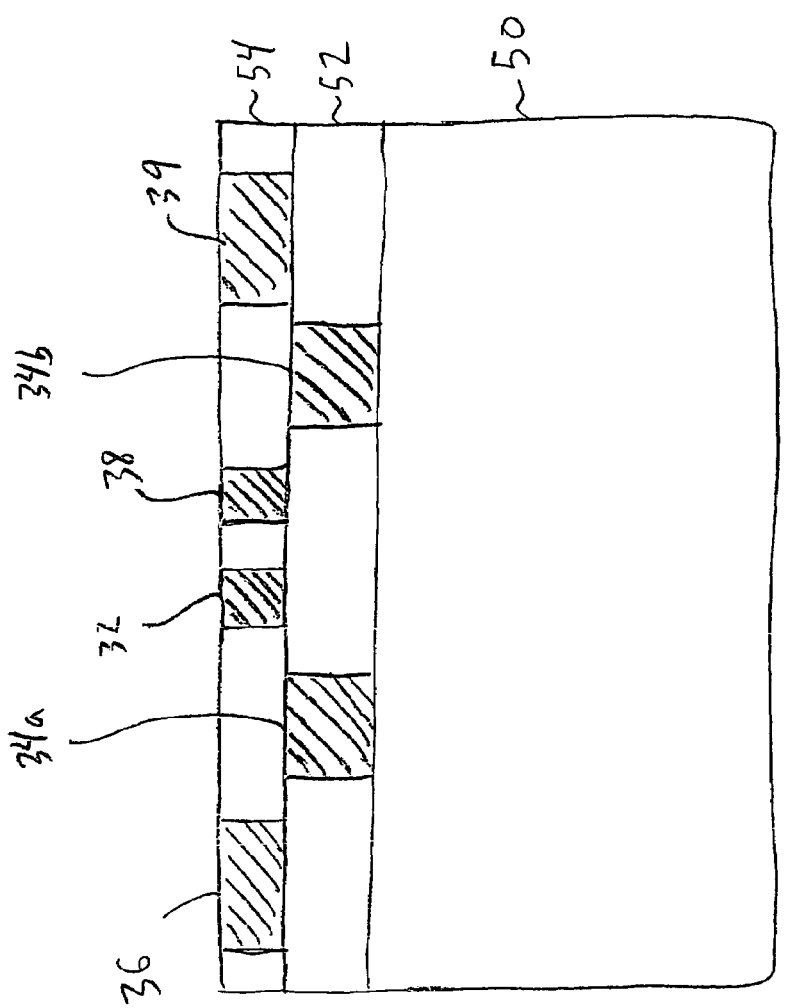
Figure 5:
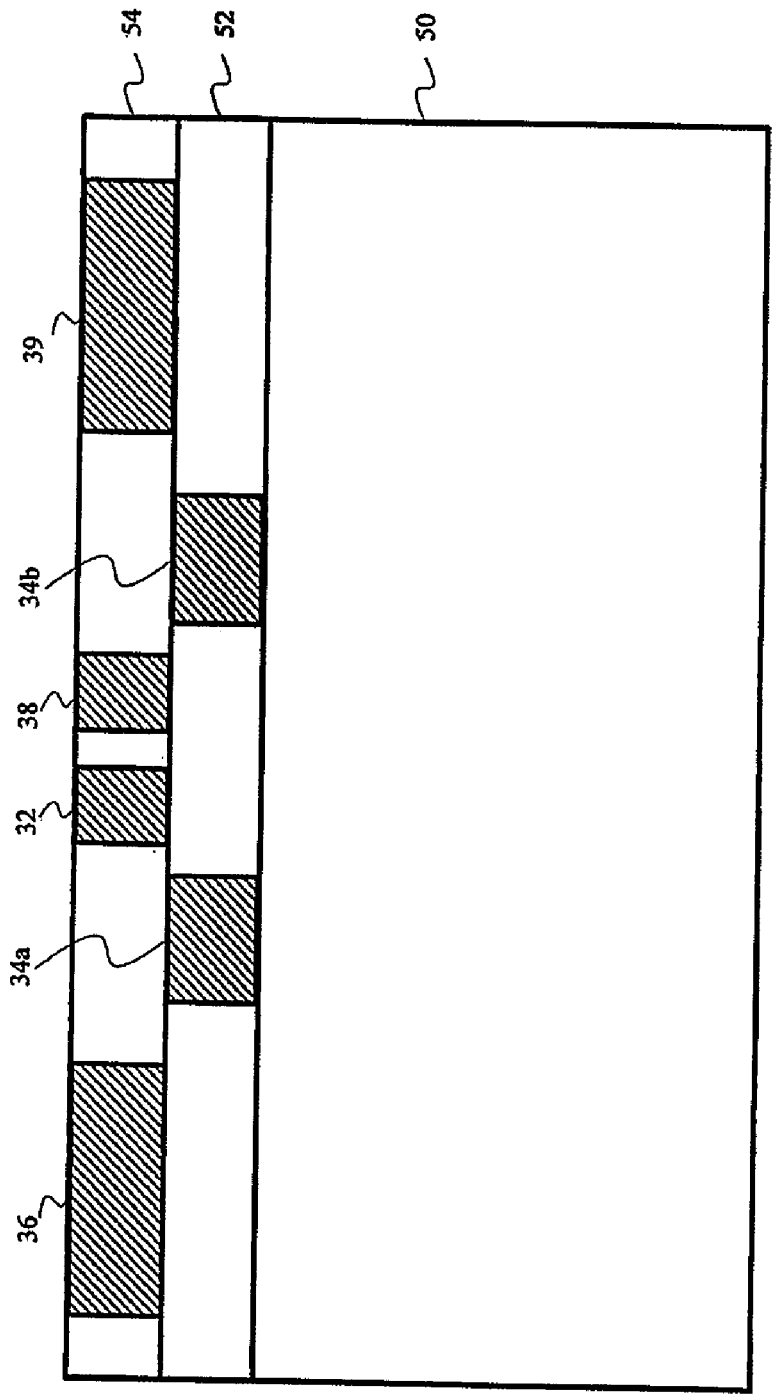
Figure 5:
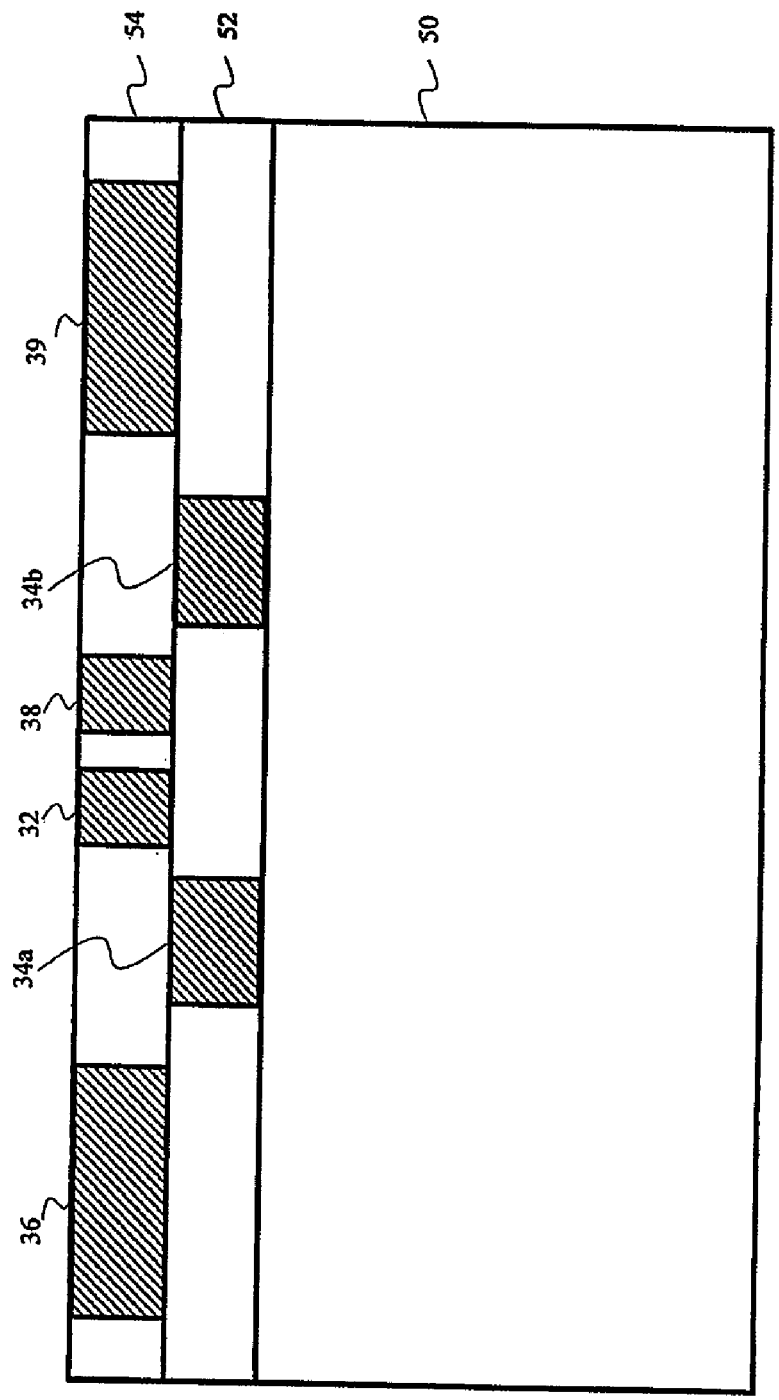

FIG. 5 is a cross-sectional view of a flex cable according to one embodiment of the present invention.

Figure 3:
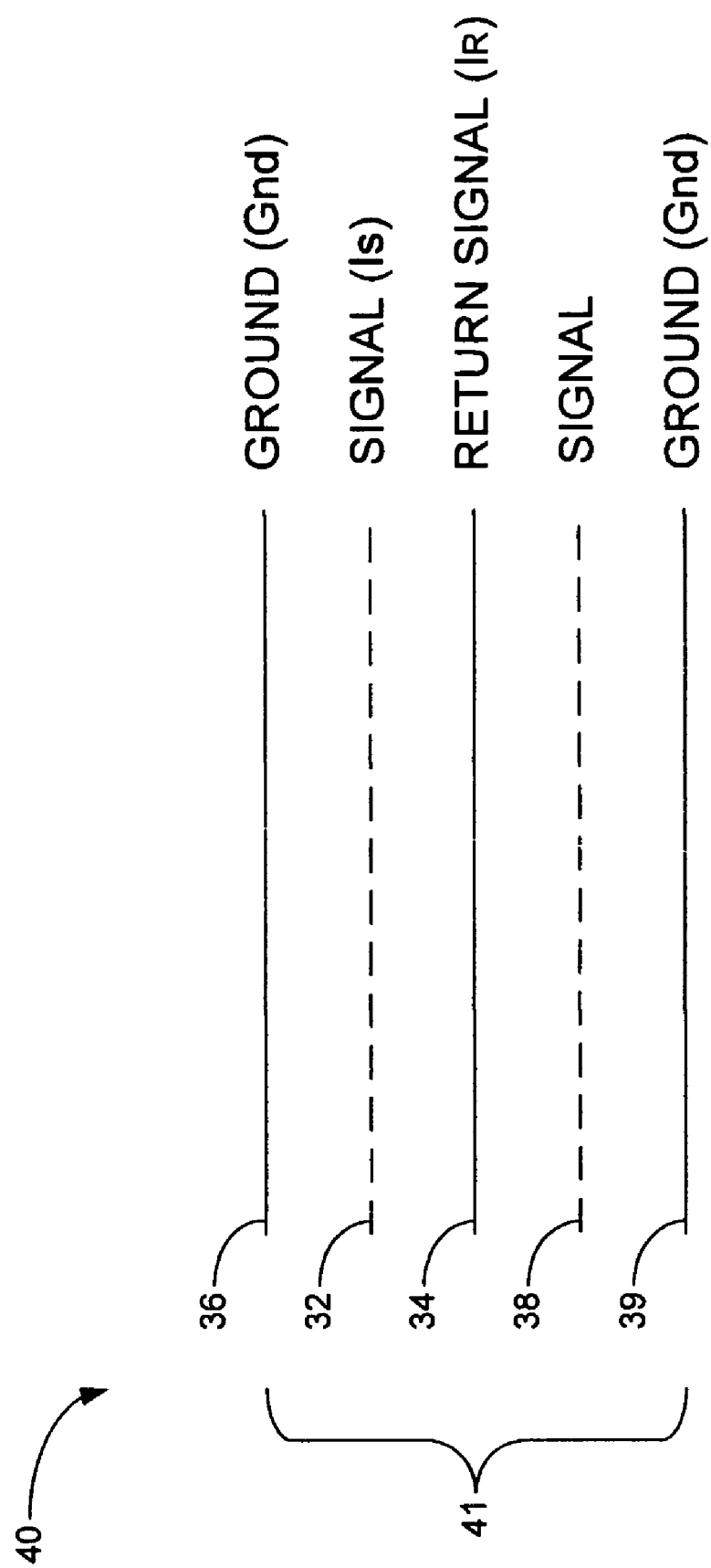
FIG. 3 illustrates a conducting-path stack-up 41 of a flex cable 40 for reducing the length and impedance of a path for the return-signal $I_R$ path according to an embodiment of the invention.

FIG. 3 illustrates a conducting-path stack-up 41 of a flex cable 40 for reducing impedance and length (and thus the signal-loop area) of a path for a return signal $I_R$ according to an embodiment of the invention. The conducting-path stack-up 41 includes the signal $I_S$ conductor 32, a conductor 34 which is also the return path $I_R$ for the signal $I_S$, and a ground conductor 36. The stack-up 41 may include other conducting paths, such as another signal conductor 38 and another ground 39.

Throughout the specification, claims, and drawings, the term "flex cable" includes a plurality of flexible conductors insulated from each other, typically having a protective casing, and arranged for providing an electrical coupling between components. A "flex cable" generally allows conductors to be used separately or in groups for carrying a signal, and typically is impedance controlled. A "flex cable" may also include any structure having a plurality of conductors carried on a flexible or partially flexible medium and arranged to electrically couple components that do not mate. A "flex cable" may also include a flat, a ribbon, or a coaxial cable structure. A "flex cable" may further include traces carried on a thin, flexible dielectric film. Further, throughout the specification, claims, and drawings, the term "coupled" means either a direct electrical connection between the things that are coupled, or an indirect connection through one or more passive or active intermediary devices.

A conductor of stack-up 41 may include any type of flexible conducting material formable into conducting paths. The conductors 32, 34, 36, 38 and 39 may comprise a wire, trace, shielded wire, plane, other conducting element, or a combination thereof. The conductor 34 is significantly wider than the conductors 32, 38 in one embodiment of the present invention as shown in FIG. 3. A conductor may have any shape, such as round, rectangular, or flat. For example, the conductor 32 may be a 50-ohm trace, and the conductors 34 and 36 may be conducting planes. The conductors may be carried on a non-conducting medium, such as a polyimide film, and electrically insulated from each other, with the space between the conductors 32–39 in FIG. 3 corresponding to such a non-conducting medium or mediums according to one embodiment of the present invention. Several non-conducting layers 50–54 are shown in a cross-sectional view of a flex cable shown in FIG. 5 according to one embodiment of the present invention. In this embodiment, return signal conductors 34a and 34b are formed on the non-conducting layer 50 and signal conductors 32 and 38 are formed on the non-conducting layer 52 between the return signal conductors 34a and 34b. Also formed on non-conducting layer 52 are ground conductors 36 and 39. The invention is not limited to any particular arrangement or number of conducting paths, number of layers, or sequence of conductors in the stack-up 41 of FIG. 3. Furthermore, the flex cable 40 may include a portion that is not flexible. This portion may be used to reinforce the structure of the flex cable 40 against abrasion or stress. The flex cable 40 may include connectors at each end for connecting to respective boards.

In another embodiment, the flex cable 40 includes another return-signal conductor (not illustrated) providing another path for the return signal portion of another driver-receiver combination. This allows the flex cable 40 to provide multiple, separate, isolated return paths for different signals.

Figure 1:
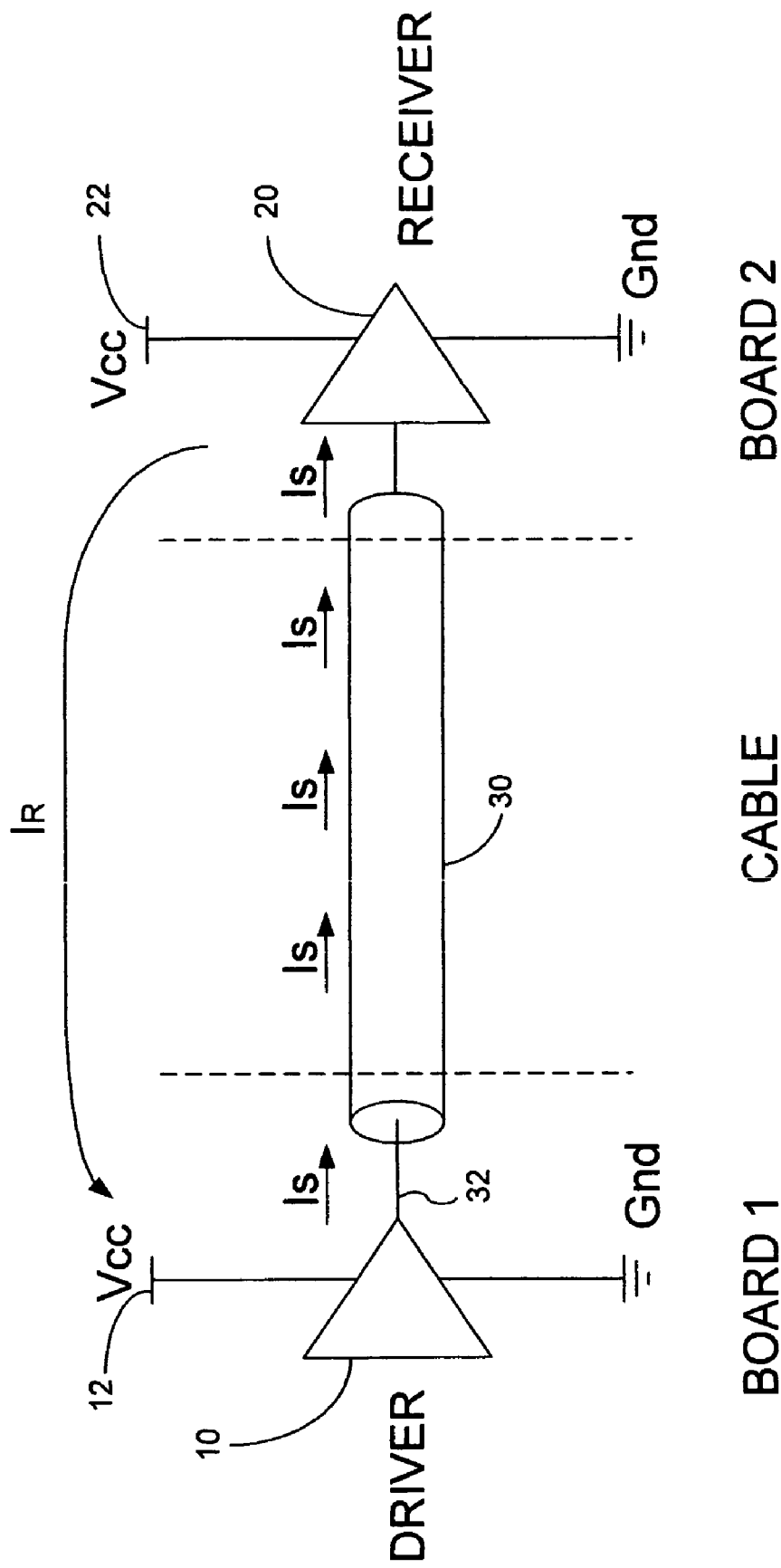
FIG. 1 is a block diagram illustrating a driver 10 located on circuit board 1 and a receiver 20 located on circuit board 2, and connected by a flex cable 30 having a conductor 32 for conducting a signal current $I_S$.
Figure 2:
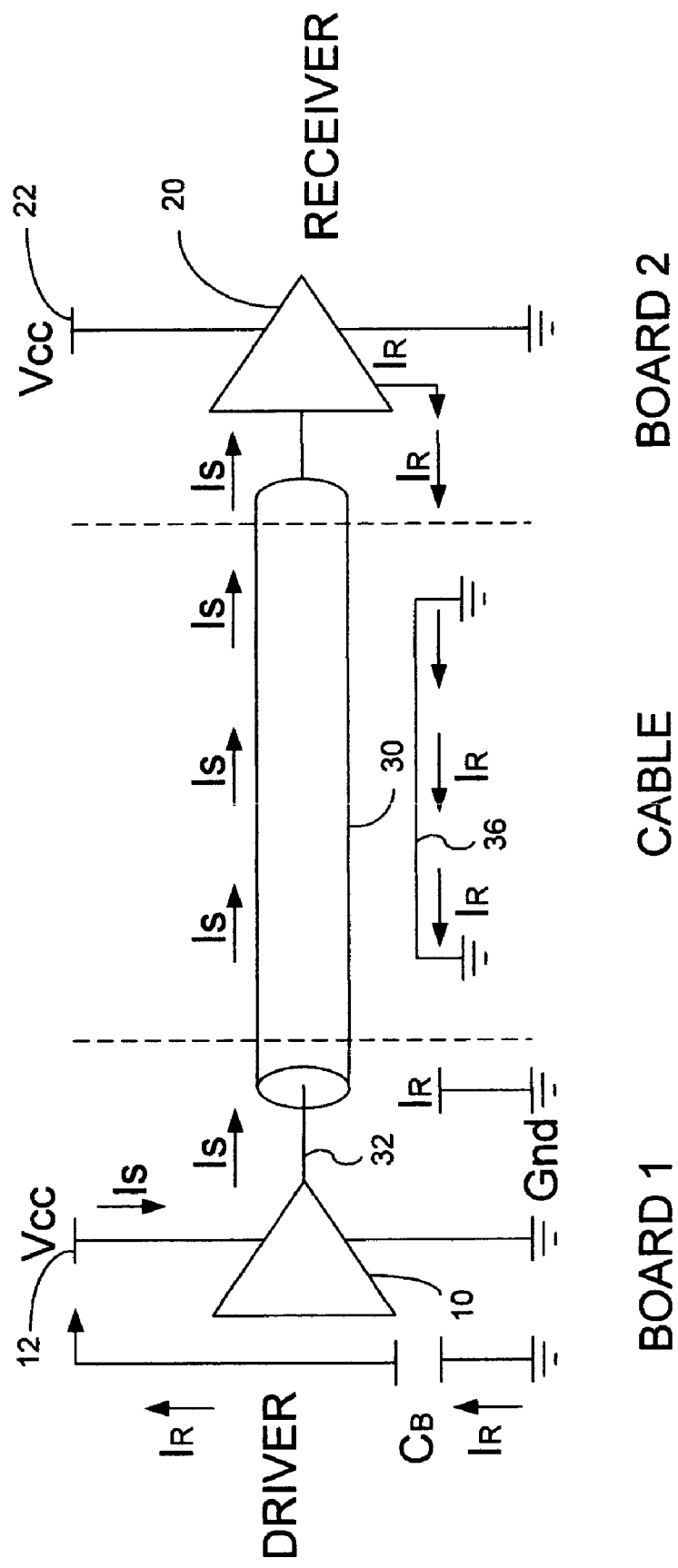
FIG. 2 is a block diagram illustrating the components of FIG. 1 where a return-signal $I_R$ path is provided by a ground plane 36 of the flex cable 30, a ground plane of driver 10, and a bypass capacitor $C_B$.
Figure 4:
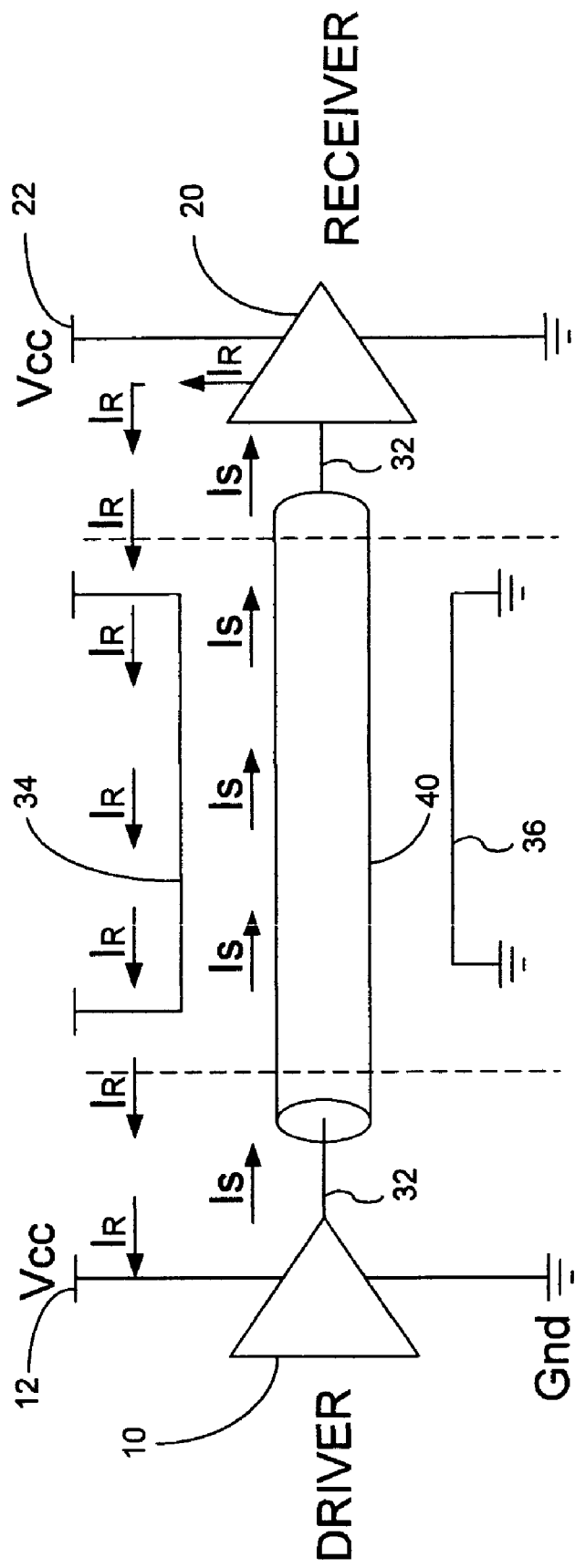
FIG. 4 illustrates the flex cable 40 of FIG. 3 used for coupling a driver 10 with a receiver 20 according to an embodiment of the invention.

FIG. 4 illustrates the flex cable 40 of FIG. 3 used for coupling the driver 10 with the receiver 20 of FIG. 2 to reduce the impedance and length of the return-signal $I_R$ path according to an embodiment of the invention. While the ground plane 36 and conductor 34 are elements of, and included within, the flex cable 40, they are diagramed outside of flex cable 40 for illustrative purposes.

The conductor 34 of the flex cable 40 provides a dedicated return-signal $I_R$ path with less impedance, fewer impedance discontinuities, and shorter length. Specifically, again assuming that the driver 10 drives the conductor 32 at a positive signal, a positive charge flows from the VCC plane 12 to the driver 10 and through the conductor 32, the receiver 20, and to the VCC plane 22 on the board 2. Then, the charge flows back to the VCC plane 12 via the return path created by the conductor 34 within the flex cable 40. Because the conductor 34 provides a direct path between the VCC plane 22 and the VCC plane 12, the conductor 34 allows an overall return-signal $I_R$ path that is significantly shorter than the return path using ground as described above in FIG. 2 where no such conductor 34 is included in the flex cable 30. In addition, the return-signal $I_R$ path through the conductor 34 includes fewer impedance discontinuities because the return path need not include any by-pass capacitors as the return path through the ground plane does as described above in conjunction with FIG. 2.

Alternatively, the conductor 34 can actually be a plane. By increasing the width of the conductor 34 from a trace width to a plane width, or to any width there between, the impedance of the conductor 34, and thus of the return-signal $I_R$ path is reduced. Of course as discussed above, reducing the length and/or impedance of the return-signal $I_R$ path reduces the cross talk and EMI generated by the signal as it propagates along the forward signal $I_S$ path and return-signal $I_R$ path.

What is claimed is:

1. An electronic system including a flex cable, comprising:
   a first power supply plane;
   a second power supply plane; and
   a flex cable including,
      a first flexible signal conductor;
      a second flexible signal conductor;
      first and second flexible return-signal conductors other than ground conductors, each return-signal conductor having a first end coupled to the first power supply plane and a second end coupled to the second power supply plane, each return-signal conductor providing a return signal path for signals on the first and second flexible signal conductors, respectively.

2. The electronic system of claim 1, further comprising a flexible ground conductor.

3. The electronic system of claim 2, wherein the first and second flexible signal conductors are positioned between the first and second return-signal conductors and the ground conductor.

4. The electronic system of claim 1, wherein the flex cable comprises a portion that is not flexible.

5. The electronic system of claim 1, further comprising a plurality of ends arranged for coupling the flex cable between a signal source including the first power supply plane and a signal receiver including the second power supply plane.

6. The electronic system of claim 5, further comprising a connector coupled to the plurality of ends of the cable.

7. The electronic system of claim 1, wherein the first and second flexible return-signal conductors comprise a flexible conductive plane.

8. The electronic system of claim 1, wherein the first and second flexible signal conductors comprise respective trace lines.

9. The electronic system of claim 1, wherein the first and second return-signal conductors are each significantly wider than the signal conductors.

10. The electronic system of claim 1, wherein the first and second flexible signal conductors and the first and second flexible return-signal conductors are disposed on a flexible non-conducting medium.

11. The electronic system of claim 1, wherein the first and second flexible return-signal conductors are separated from the first and second flexible signal conductors by one layer of a flexible non-conducting medium.

12. The electronic system of claim 1, wherein the first and second flexible return-signal conductors are carried on one layer of a flexible, non-conducting medium and the first and second flexible signal conductors are carried on another layer of a flexible, non-conducting medium.

13. The electronic system of claim 1, wherein the first and second signal conductors and the first and second return-signal conductors are arranged relative to each other to minimize a current loop area between them.

14. An electronic system, comprising:
a driver including a power supply plane and an output, the driver operable to provide a signal on the output;
a receiver including a power supply plane and an input, the receiver operable to receive a signal supplied on the input; and
a flex cable including,
a flexible signal conductor; a flexible power-supply plane having a first end coupled to the power supply plane in the driver and a second end coupled to the power supply plane in the receiver, the flexible power-supply plane functioning as a return signal path for signals on the signal conductor; and
a flexible ground plane.

15. The electronic system of claim 14, wherein the flex cable further comprises a portion that is not flexible.

16. The electronic system of claim 14, wherein the flexible ground plane is carried by a layer of flexible, non-conducting medium, the flexible power-supply plane is carried by another layer of flexible, non-conducting medium, and the flexible signal conductor is positioned between the ground plane and the power-supply plane.

17. The electronic system of claim 16, wherein the flexible signal conductor is carried by a third flexible, non-conducting medium.

18. The electronic system of claim 16, wherein one of the layers of the flexible, non-conducting medium includes two opposed sides with one side carrying one of the flexible power-supply plane and the flexible ground plane, and the other side carrying the flexible signal conductor.

19. An assembly, comprising:
a signal source;
a signal receiver; and
a flex cable having a first flexible signal conductor for coupling a signal between the source and receiver and a second flexible signal conductor for coupling a signal between the source and receiver, and first and second flexible return-signal conductors being other than ground conductors and providing respective return signal paths for signals on the first and second flexible signal conductors, and wherein the respective return signal paths include no bypass capacitors.

20. A method of minimizing an impedance of a return-current path between a first signal source and a first signal receiver, the first signal source including a power supply plane and the first signal receiver including a power supply plane and the method comprising:
delivering a first signal from the first signal source to the first signal receiver with a flexible conductor; and
providing a return signal path for the first signal from the power supply plane in the receiver to the power supply plane in the source, wherein providing the return signal path further comprises providing a return signal path having no impedance discontinuties in the form of bypass capacitors.

* * * * *

UNITED STATES PATENT AND TRADEMARK OFFICE
CERTIFICATE OF CORRECTION

| | | |
|---|---|---|
| PATENT NO. | : 7,026,545 B2 | Page 1 of 2 |
| APPLICATION NO. | : 10/447939 | |
| DATED | : April 11, 2007 | |
| INVENTOR(S) | : Andrew Harvey Barr, Jeremy Ian Wilson and Robet William Dobbs | |

It is certified that error appears in the above-identified patent and that said Letters Patent is hereby corrected as shown below:

Delete Drawing sheet 5 and substitute therefor the drawing sheet, consisting of Fig 5 as shown on the attached page.

In Column 1, Line 49, "Is" should be "$I_s$."

Signed and Sealed this

Twenty-fourth Day of July, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,026,545 B2 | Page 1 of 2 |
| APPLICATION NO. | : 10/447939 | |
| DATED | : April 11, 2006 | |
| INVENTOR(S) | : Andrew Harvey Barr, Jeremy Ian Wilson and Robet William Dobbs | |

It is certified that error appears in the above-identified patent and that said Letters Patent is hereby corrected as shown below:

Delete Drawing sheet 5 and substitute therefor the drawing sheet, consisting of Fig 5 as shown on the attached page.

In Column 1, Line 49, "Is" should be "$I_s$"

This certificate supersedes Certificate of Correction issued July 24, 2007.

Signed and Sealed this

Fourteenth Day of August, 2007

JON W. DUDAS
*Director of the United States Patent and Trademark Office*